(12) United States Patent
Cole et al.

(10) Patent No.: US 11,365,492 B2
(45) Date of Patent: Jun. 21, 2022

(54) SUBSTRATE-TRANSFERRED STACKED OPTICAL COATINGS

(71) Applicant: Thorlabs, Inc., Newton, NJ (US)

(72) Inventors: Garrett Cole, Santa Barbara, CA (US); Christoph Deutsch, Pinkafeld (AT)

(73) Assignee: Thorlabs, Inc., Newton, NJ (US)

( * ) Notice: Subject to any disclaimer, the term of this patent is extended or adjusted under 35 U.S.C. 154(b) by 71 days.

(21) Appl. No.: 16/128,503

(22) Filed: Sep. 11, 2018

(65) Prior Publication Data

US 2020/0080231 A1 Mar. 12, 2020

(51) Int. Cl.
| | |
|---|---|
| *C30B 33/06* | (2006.01) |
| *C30B 23/02* | (2006.01) |
| *G02B 1/02* | (2006.01) |
| *C30B 29/68* | (2006.01) |
| *G02B 5/08* | (2006.01) |
| *C30B 29/40* | (2006.01) |

(52) U.S. Cl.
CPC .............. *C30B 33/06* (2013.01); *C30B 23/02* (2013.01); *C30B 29/40* (2013.01); *C30B 29/68* (2013.01); *G02B 1/02* (2013.01); *G02B 5/0833* (2013.01)

(58) Field of Classification Search
CPC ......... C30B 23/02; C30B 29/40; C30B 29/68; C30B 33/06; G02B 1/02; G02B 5/0833
See application file for complete search history.

(56) References Cited

U.S. PATENT DOCUMENTS

| | | | |
|---|---|---|---|
| 2002/0030198 A1* | 3/2002 | Coman | H01L 33/0093 257/103 |
| 2005/0040212 A1* | 2/2005 | Yang | H01L 33/0093 228/254 |

(Continued)

FOREIGN PATENT DOCUMENTS

| | | |
|---|---|---|
| EP | 2607935 A1 | 6/2013 |
| EP | 2645429 A1 | 10/2013 |
| GB | 2346480 A | 8/2000 |

OTHER PUBLICATIONS

Extended European Search Report issued for European Patent Application No. 16160751.0, dated Sep. 22, 2016.

(Continued)

*Primary Examiner* — Hua Qi
(74) *Attorney, Agent, or Firm* — Myers Wolin, LLC

(57) ABSTRACT

A method for manufacturing substrate-transferred optical coatings, comprising: a) providing a first optical coating on a first host substrate as a base coating structure; b) providing a second optical coating on a second host substrate; c) bonding the optical coating of the base coating structure to the second optical coating, thereby obtaining one combined coating; d) detaching one of the first and the second host substrates from the combined coating; determining if the combined coating fulfills a predetermined condition; e) if the result of the determining step is negative, taking the combined coating together with the remaining host substrate as the base coating structure to be processed next and continuing with step b); f) if the result of the determining step is positive, providing an optical substrate and bonding the optical substrate to the combined coating; g) removing the other one of the first and the second host substrate.

15 Claims, 8 Drawing Sheets

(56) References Cited

U.S. PATENT DOCUMENTS

| | | | | |
|---|---|---|---|---|
| 2005/0285128 A1* | 12/2005 | Scherer | .................. | H01L 33/38 |
| | | | | 257/98 |
| 2009/0278233 A1* | 11/2009 | Pinnington | ....... | H01L 21/02389 |
| | | | | 257/615 |
| 2014/0063606 A1* | 3/2014 | Aspelmeyer | ......... | G02B 5/0816 |
| | | | | 359/584 |
| 2014/0064315 A1* | 3/2014 | Dummer | ............... | H01S 5/0261 |
| | | | | 372/50.124 |
| 2015/0083202 A1* | 3/2015 | Ghyselen | .......... | H01L 31/03046 |
| | | | | 136/255 |

OTHER PUBLICATIONS

Office Action issued for European Patent Application No. 16160751.0, dated Nov. 15, 2018.

Office Action issued for European Patent Application No. 16160751.0, dated Apr. 15, 2019.

Cole, Garrett D., et al., "Tenfold reduction of Brownian noise in high-reflectivity optical coatings," Nature Photonics, Aug. 1, 2013, pp. 644-650, vol. 7, No. 8.

Bai, Yu, et al., "Fabrication of GaAs-on-Insulator via Low Temperature Wafer Bonding and Sacrificial Etching of Ge by XeF2," Journal of The Electrochemical Society, Dec. 28, 2011, pp. H183-H190.

Communication pursuant to Article 94(3) EPC issued by the European Patent Office for corresponding European Patent Application No. 16 199 794.5, dated Apr. 20, 2020.

Cole et al., "Tenfold reduction of Brownian noise in high-reflectivity optical coatings", Nature Photonics, Aug. 1, 2013; pp. 644-650, vol. 7, No. 8.

European Search Report issued by the European Patent Office for corresponding European Patent Application No. EP 16199794.5 dated May 24, 2017.

Communication pursuant to Article 94(3) EPC issued by the European Patent Office for corresponding European Patent Application No. 16 199 794.5-1103, dated Feb. 5, 2021.

* cited by examiner

SUBSTRATE-TRANSFERRED STACKED OPTICAL COATINGS

FIELD OF THE PRESENT DISCLOSURE

The present disclosure relates to a method for manufacturing substrate-transferred stacked optical coatings.

BACKGROUND OF THE PRESENT DISCLOSURE

Highly reflective optical interference coatings are indispensable tools for modern scientific and industrial efforts. Systems with ultralow optical losses, namely parts-per-million, ppm, levels of scatter and absorption, were originally developed for the construction of ring-laser gyroscopes in the late 1970s, cf. U.S. Pat. No. 4,142,958. As an outcome of this, ion-beam sputtering, IBS, has been established as the gold standard process technology for generating ultralow-loss reflectors in the visible and near infrared, NIR. Typically, such multilayers consist of alternating layers of amorphous metal-oxides, most commonly high index $Ta_2O_5$, tantala, and low index $SiO_2$, silica, thin films, finding application in narrow-linewidth laser systems for optical atomic clocks, gravitational wave detectors, cavity QED, and tests of fundamental physics. Still, limitations of these amorphous coatings include excess Brownian noise, negatively impacting the limiting performance of precision optical interferometers, poor thermal conductivity, typically below 1 $Wm^{-1}K^{-1}$, as well as significant levels of optical absorption for wavelengths beyond 2 µm, excluding operation of such low-loss reflectors in the mid-infrared, MIR. The latter limitation means that the highest performing metal oxide structures, while exhibiting phenomenal performance in the visible and NIR, cannot operate with low losses in this important long-wavelength region and thus requires a switch to amorphous II-VI, group IV, or IV-VI compounds which are less well developed.

EP 11 010 091 discloses a mirror assembly based on a monocrystalline Bragg mirror bonded to a curved carrier substrate and a process of manufacturing the mirror assembly. Additionally, EP 11 010 091 describes an optical resonator system comprising a pair of such mirror assemblies forming an optical cavity for application in optical precision measurement systems. Processes disclosed therein proved very robust from a manufacturing point of view and have been proven to yield a number of improved performance metrics when compared with IBS-deposited amorphous metal oxide coatings. The proven advantages of crystalline coatings based on substrate-transferred GaAs/AlGaAs multilayers include a significant reduction in Brownian noise when compared with typical dielectric mirror systems, with demonstrated loss angles $<4\times10^{-5}$ at room temperature and the potential for $\sim5\times10^{-6}$ at cryogenic temperatures near 10 K, a superior thermal conductivity of at least 30 $Wm^{-1}K^{-1}$ compared with 1 $Wm^{-1}K^{-1}$ for low-optical-loss $Ta_2O_5/SiO_2$ multilayers, and finally the ability to realize ppm-level optical absorption losses for wavelengths in the 1 µm to 10 µm range.

These monocrystalline coatings are typically grown via molecular beam epitaxy, where the total thickness is effectively limited to ~15-20 µm due to technological restrictions including significant drift of the growth rate during such long crystal growth runs, inherent build-up of strain due to lattice mismatch, as well as the accumulation of surface defects within such a thick structure. As a consequence of these issues, the quality and ultimate optical performance typically degrades for very thick single-crystal coatings. However, thicker coatings having a thickness at or beyond 20 µm are necessary for ultra-high reflectivity mirrors, in particular for the mid-infrared spectral region for mirror center wavelengths in excess of 2 µm.

Given the rapidly expanding interest in such low-noise end mirrors at these long operating wavelengths, primarily in the region from 2 to 10 µm, further improvements of the optical performance of these substrate-transferred crystalline coatings, particularly the position dependence of the optical scatter losses, is now in high demand from the ultimate end users.

SUMMARY OF THE PRESENT DISCLOSURE

The present disclosure provides an alternative solution to overcome the above-mentioned limitations, namely a means to reduce the overall optical losses and improve the position dependence of the coating optical properties. With the use of crystalline multilayers of high mechanical quality, it also serves to significantly reduce the Brownian noise of the mirror materials while simultaneously exhibiting optical performance on par with IBS deposited multilayer mirrors.

Within the present disclosure, the term crystalline, single crystal or monocrystalline refers to a low defect density single-crystal film as can be produced via epitaxial growth techniques, such as molecular beam epitaxy, MBE; metalorganic vapor phase epitaxy, MOVPE; liquid phase epitaxy, LPE; etc. In this application the terms crystalline and monocrystalline may be used interchangeably. It is important to note that a single crystal or monocrystalline material structure will still exhibit a finite number of defects or dislocations. However, a monocrystalline material does not contain grain boundaries and defects associated with said boundaries, separating neighboring crystallites of varying orientation in a polycrystalline sample.

Within the present disclosure the term low absorption should be understood to indicate an absorption level with a maximum upper limit of 100 ppm. Preferably, this may be reduced to <10 ppm or even into the range below 1 ppm.

Within the present disclosure, the term "dielectric multilayer coating" corresponds to a "thin film coating" which may also be referred to as a "multilayer mirror." The term mirror assembly refers to the multilayer coating together with the substrate.

Within the present disclosure the term host substrate should be understood as a synonym for donor substrate as well as growth substrate.

The present disclosure provides a method for manufacturing substrate-transferred optical coatings, comprising: a) providing a first optical coating on a first host substrate as the base coating structure; b) providing a second optical coating on a second host substrate; c) directly bonding the optical coating of the base coating structure to the second optical coating, thereby obtaining one combined coating; d) detaching one of the first and the second host substrates from the combined coating; determining if the combined coating fulfills a predetermined condition; e) if the result of the determining step is negative, taking the combined coating together with the remaining host substrate as the base coating structure to be processed next and continuing with step b); f) if the result of the determining step is positive, providing an optical substrate and directly bonding the optical substrate to the combined coating; g) removing the other one of the first and the second host substrate.

In the method of the present disclosure the coating structure comprises two or more individual multilayers that are combined together to form a single transferred optical interference coating, called the combined coating. Thus, at least two individual coating structures are stacked in a separate processing step in order to generate one final coating structure by exploiting wafer-scale direct-bonding technology. This is achieved prior to the final substrate-transfer step, whereby the coating is applied to an arbitrary optical substrate.

By applying this stacking procedure, monocrystalline optical interference coatings with essentially arbitrary thickness can be manufactured. Furthermore, multi-material coatings may be realized allowing for arbitrary mixtures of single-crystal and non-crystalline coating materials as components of the combined coating.

The method may also be written as a loop using: i1) setting a positive counter i=1; i2) providing an i-th optical coating on an i-th host substrate; i3) providing an (i+1)-th optical coating on an (i+1)th host substrate; i3) directly bonding the (i+1)th optical coating to the i-th optical coating, thereby obtaining one combined coating; i4) detaching one of the i-th and the (i+1)th host substrate from the combined coating; determining if the combined coating fulfills a predetermined condition; i5) if the result of step i4) is negative, increasing i by 2, re-defining the combined coating as the i-th coating on the i-th host substrate, and continuing with step i3); i6) if the result of step i5) is positive, providing an optical substrate and directly bonding the optical substrate to the combined coating; i7) removing the other one of the i-th and the (i+1)th host substrate.

The bonding or stacking step may also be viewed as follows. Both the first host substrate and the first coating, being of finite thickness, are comprised of two surfaces, one of which may be identified as the top surface of the respective substrate, the other as the bottom surface. For both the first host substrate and the first coating, one of the two surfaces of each substrate will be chosen as the surface on which further work is applied. That surface will then be identified as being the top surface of the host substrate and the coating respectively.

Bonding the first optical coating to the second optical coating may also be viewed as flipping, whereby one of the first or the second optical coatings is turned over by 180 degrees such that the two coatings come face to face and then are attached by a direct bonding process.

The stacking process, realized via direct bonding of the individual coating structures, e.g. coatings, may be performed with a planar sample geometry, ideally using standard wafer sizes, and thus allows for the exploitation of various existing, highly-mature and commercially-relevant bonding technologies with and without intermediate layers, and can be extended to active devices through the addition of buried metallic electrodes for active electro-optic features in a metal-metal thermo-compression bonding step.

The stacking process employed prior to the substrate-transfer coating step reduces the impact of scatter loss that may be driven by growth defects on the surface of the multilayer. After stacking, such defects would be buried at the bonding interface below the surface. Growth defects are detrimental for the quality of the bond with the optical substrate. Growth defects can cause voids and thus have a negative influence on the wavefront error. Buried growth defects have less influence on the wavefront error in stacked optical coatings as higher quality bond interfaces can be achieved with planar samples, e.g. high pressure can be uniformly applied for planar geometries.

In the method as described above, wherein the predefined condition may include whether a thickness of the combined coating is larger than a predefined thickness or wherein the predefined condition may include whether a predefined number n of repetitions of steps b) to d) has been performed, where n is a positive integer larger than or equal to 1.

Thus, after the combining of the initial pair of coatings, adding a second coating may be performed as often as necessary to fulfill a predefined requirement. This may be achieving a certain number of repetitions and/or achieving a certain thickness of the combined coating, wherein the thickness of the combined coating may be measured using well-understood measuring methods. For example, repetitions are to stop once where i≥n, where i may be increased as indicated above.

In the method as described above, the first host substrate and the second host substrate may be substantially similar.

Alternatively, in the method as described above, the first host substrate and the second host substrate may differ in thickness and/or material.

In the method as described above, the first optical coating and the second optical coating may be substantially similar or even from the very same growth run in a multi-wafer deposition system.

In the method as describe above, at least one second optical coating differs from the first optical coating in thickness and/or material.

Thus, identical source wafers may be employed for achieving arbitrary thickness. Alternatively, different source wafers, e.g. different host substrates, amorphous/crystalline, electro-active/passive structures etc., may be applied and different multilayer structures may be used according to the needs of the application.

In the method as described above, the first optical coating and/or the second optical coating may be a single crystal optical coating, wherein the step of forming the first optical coating and/or the second optical coating optical coating on the respective first or second host substrate may comprise depositing the first optical coating and/or the second optical coating, respectively, via an epitaxial growth technique, for example molecular beam epitaxy, MBE, or organometallic vapor-phase epitaxy.

In the method as described above, the step of forming the first and/or the second optical coating may further comprise lithographically defining the lateral geometry of the first and/or the second optical coating.

In the method as described above, the step of forming the first and/or the second optical coating further may further comprise extruding the defined lateral geometry of the first and/or the second optical coating and at least partially into the respective first and/or second host substrate by means of chemical etching; or the step of forming the first and/or the second optical coating may further comprise singulating the first and/or the second optical coating using mechanical dicing and/or grinding processes and removing remaining substrate off the respective optical coating via selective chemical etching.

In the method as described above, the step of directly bonding the optical substrate to the combined coating may further comprise: pressing the combined coating into direct contact with the optical substrate surface using a press, thereby obtaining a bond between the combined coating and the optical substrate, wherein if the optical substrate has a concave surface using a convex press of equal and opposite or smaller radius of curvature, else if the optical substrate is planar using a planar press; wherein the pressing may be realized by clamping together the optical substrate, optical coating, and the press at a controlled pressure value; and optionally further comprising annealing of the bonded optical substrate for example at a temperature between 70° C.-300° C. and for times spanning one to twenty four hours; and optionally removing any remaining host substrates post-bonding by means of chemical etching.

In the method as described above, the optical substrate may be curved having a radius of curvature, ROC, between 0.1 m and 10 m or between 0.5 km and 10 km.

In the method as described above, the first host substrate may comprise GaAs, Ge, or Si; and the optical substrate may be transparent, in particular at a wavelength of 1064 nm or 1550 nm, or for MIR wavelengths between 2 and 10 µm and wherein the top surface of the optical substrate may be polished.

In the method as described above, the optical substrate may comprise $SiO_2$, sapphire, ultra-low expansion glass, ULE, Si, Ge, and ZnSe.

In the method as described above, the optical coating may comprise crystalline semiconductor layers being monocrystalline epitaxial layers based on an AlGaAs ternary alloy, wherein the first and second type may comprise $Al_xGa_{1-x}As$ with 0<x<1; wherein for the layers of the first type x is smaller than for layers of the second type.

In a stacked structure, the individual components of the coatings may consist of monocrystalline materials with different lattice constants, e.g. GaAs-based, InP-based, GaN-based materials etc. or a combination of these, as well as fully amorphous materials, polycrystalline materials, or mixtures of each. This additional degree of freedom enables the design of advanced passive and active features of structures as well as optical coatings that cannot be realized with a single material platform.

The present disclosure further provides a direct-bonded optical coating obtained by the manufacturing method as described above.

The above and other aspects, features and advantages of the present disclosure will become more apparent from the following detailed description when taken in conjunction with the accompanying drawings.

In summary, this disclosure covers the production of separately stacked coatings for a subsequent substrate-transfer step in order to transfer the previously stacked coating onto arbitrary substrates. The stacking procedure allows for various technological barriers to be overcome, including limitations of the total thickness for various crystal growth techniques as employed for the production of ultralow-loss optical coatings, as well as reductions in defect densities that may degrade the final performance of the optic. Both the optical quality and surface quality necessary for the substrate-transfer coating process, or also to combine two different coating materials or structures including monocrystalline materials with different lattice constant, various amorphous and polycrystalline materials, electro-optically passive and active structures, or combinations therein.

DETAILED DESCRIPTION

Figure 1:
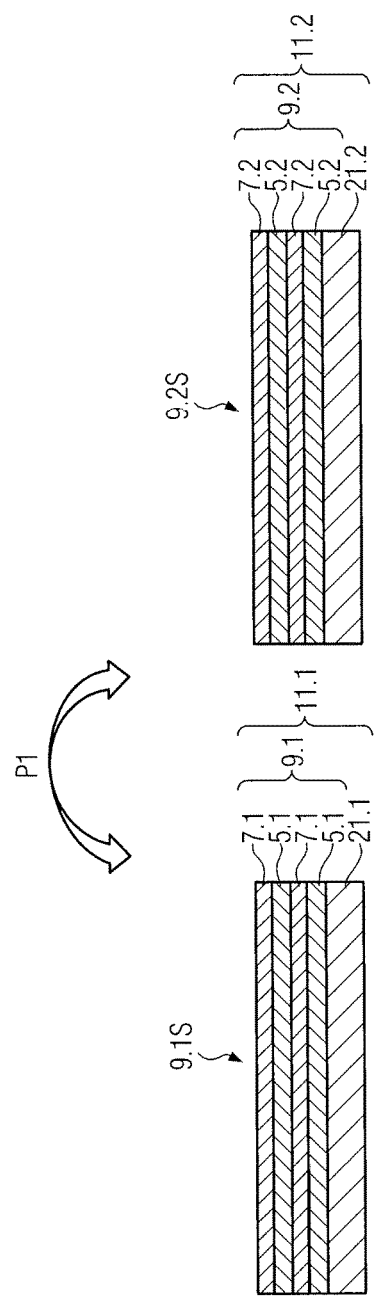
FIG. 1: A schematic view of the start of the manufacturing process steps according to the present disclosure.

FIG. 1 illustrates a side view of an optical coating 9.1 provided on a host substrate 21.1 which form a base coating structure 11.1. The optical coating 9.1 may be denoted as a first optical coating and the host substrate 21.1 may be denoted as a first host substrate. The optical coating 9.1 may comprise layers 5.1 and 7.1. In an oversimplified schematic drawing the optical coating 9.1 is illustrated having only four layers 5.1, 7.1, respectively, provided in an alternating way. It should be understood, however, that the coating 9.1 typically comprises many more layers. The maximum reflectivity of the coating may be determined by the refractive index contrast of the individual layers, the total number of layers, as well as the refractive index of the substrate—asymptotically approaching a reflectivity of 100%. The number of layers for the present example may be about 40 pairs of layers, i.e. 80 total layers, but other numbers of layers such as 100-120 total layers may be used for such a structure. The layers 5.1 and 7.1 as shown in FIG. 1 are monocrystalline semiconductor layers alternating with respect to having a high and a low index of refraction, respectively. In FIG. 1, it may be assumed that layers 5.1 correspond to the layers having a low index of refraction whereas layers 7.1 correspond to the layers having a high index of refraction. Typically the difference in refractive index should be as large as possible; for example with AlGaAs at a wavelength of 1064 nm index values of 3.48 and 2.94 may be used for an implementation made from GaAs and $Al_{0.92}Ga_{0.08}As$ layers respectively. The stack of layers 5.1 and 7.1 form a coating 9.1 that in combination with the host substrate 21.1 form the base coating structure denoted by reference sign 11.1.

The coating 9.1 of FIG. 1 is provided onto the host substrate 21.1 via a suitable deposition technique. For example, the optical coating 9.1 may be a single-crystal multilayer as can be produced via epitaxial growth techniques, MBE, MOVPE, LPE, etc. The coating 9.1 may comprise a monocrystalline Bragg mirror. It should be understood that the term monocrystalline refers to a low defect density single-crystal film. Throughout this text, the terms crystalline and monocrystalline may be used interchangeably.

The host substrate 21.1 may be a semiconductor wafer. Said semiconductor wafer may be a standard wafer having a standard wafer size. Additionally or alternatively, the host substrate 21.1 may comprise monocrystalline GaAs, germanium, Ge, or silicon, Si, InP, InSb, or $BaF_2$, although other materials may also be possible, depending on the desired operating wavelength for the application. Such materials may additionally comprise InP, or GaN/AlN. The thickness of the growth substrate is typically around 300-500 µm though values between 50 µm and 1 mm are possible.

FIG. 1 further discloses a side view of another optical coating 9.2 provided on a host substrate 21.2 which form another or second coating structure 11.2. The optical coating 9.2 may be denoted as a second optical coating and the host substrate 21.2. may be denoted as a second host substrate. The optical coating 9.2 may comprise layers 5.2 and 7.2. As indicated in FIG. 1 the number of layers 5.2 and 7.2 may be the same as for the base coating structure 11.1. Also, the sequence of layers 5.2 and 7.2 as well as their parameters may be the same as for the first optical coating 9.1, such that the coating structure 11.2 is similar or even equal to the coating structure 11.1. This then provides a starting point for accumulating arbitrary coating thickness as will be described, below.

In another example the coating structure 11.2 may differ from the first coating structure 11.1. The difference between the coating structure 11.1 and 11.2 may then comprise different materials and/or different thicknesses of the host substrate 21.2 as compared to the host substrate 21.1. Additionally or alternatively the host substrates 21.1 and 21.2 may be similar or equal and instead the layers 5.1 and 7.1 of the optical coating 9.1 may be different from the layers 5.2 and 7.2 of the optical coating 9.2. This then describes a starting point for using different source wafers as host substrates, such as amorphous and/or crystalline structures, electro-active and/or passive structures etc. Thus, for this example, in a stacked structure, the individual components of the coating may consist of monocrystalline materials with different lattice constants, e.g. GaAs-based, InP-based, GaN-based materials etc. or a combination of these, as well as fully amorphous materials, polycrystalline materials, or mixtures of each. This additional degree of freedom enables the design of advanced passive and active features of structures as well as optical coatings that cannot be realized with a single material platform.

FIG. 1 further indicates a double arrow P1 which should indicate that the base coating structure 11.1 is to be bonded to the second coating structure 11.2. The double arrow P1 indicates that it is an arbitrary choice whether to bond the structure 11.1 to the structure 11.2 or vice versa. The first coating structure 11.1 has a top surface—or free surface—9.1S facing away from the first host substrate 21.1 and the second coating structure 11.2 similarly has a top surface 9.2S facing away from the respective host substrate 21.2. Bonding the base coating structure 11.1 to the second coating structure 11.2 thus means bonding the first optical coating 9.1 to the second optical coating 9.2. This means that the top surface 9.1S of the first optical coating 9.1 is bonded to the top surface 9.2S of the second optical coating 9.2.

This bonding step is a direct bonding step, e.g. the first coating structure 11.1 is directly bonded to the second coating structure 11.2 direct bonding, i.e. with no intermediate adhesive layers between the outermost layers or likewise between the respective surfaces 9.1S and 9.2S. The top surface 9.1S and the top surface 9.2S each may be polished preferably to a maximum roughness of ~1 nm RMS in order to enable successful direct bonding.

The step of forming the first and/or the second optical coating 9.1 and/or 9.2, respectively, may further comprise extruding a defined lateral geometry of the first and/or the second optical coating 9.1 and/or 9.2 and at least partially into the respective first and/or second host substrates 21.1 and/or 21.2 by means of chemical etching. Also; the step of forming the first and/or the second optical coating 9.1 and/or 9.2, respectively, may comprise singulating the first and/or the second optical coating 9.1, 9.2 using mechanical dicing and/or grinding processes and removing remaining substrate off the respective optical coating 9.1 and 9.2 via selective chemical etching.

FIGS. 2-10 illustrate schematically process steps according to the present disclosure.

Figure 2:
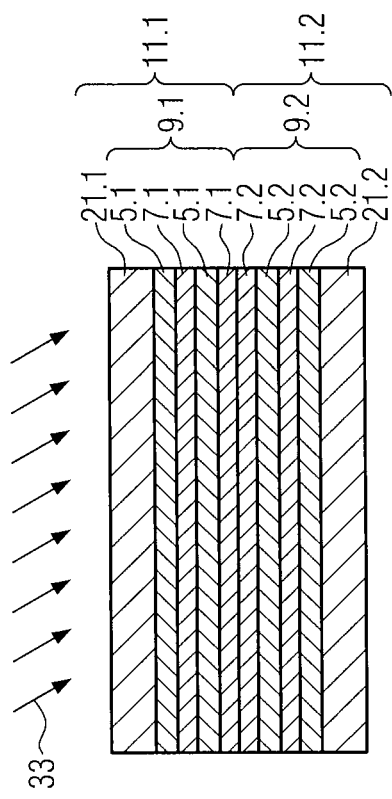
FIG. 2: A schematic view of a subsequent process according to the present disclosure.

FIG. 2 illustrates a combined or stacked coating structure of the first or base coating structure 11.1 and the second coating structure 11.2, the combined coating structure being the result of the bonding step as described above with respect to FIG. 1. FIG. 2 illustrates having the base coating structure 11.1 and the second coating structure 11.2 bonded to each other such that the respective first and second coatings 9.1 and 9.2 are combined to each other by bonding, and the first and second coatings 9.1 and 9.2 sandwiched between the first and second host substrates 21.1 and 21.2, respectively.

By combining the first coating structure 11.1 and the second coating structure, it is also possible that a majority of growth defects may become buried at the bonding interface between the two structures instead of the top layers facing outward after the combining step. Growth defects present at the surface have a negative influence on the optical scatter as well as the wavefront error. Buried growth defects have less influence on optical losses, including scatter, and may also have a reduced impact on the wavefront error in stacked optical coatings as a higher quality bond interfaces can be achieved with planar samples. Thus, by burying these defects it may be possible to have a reduction in the coating scatter loss to levels below 5 ppm, which is an improvement of a factor of 2-4 compared to previously applied processes.

Figure 3:
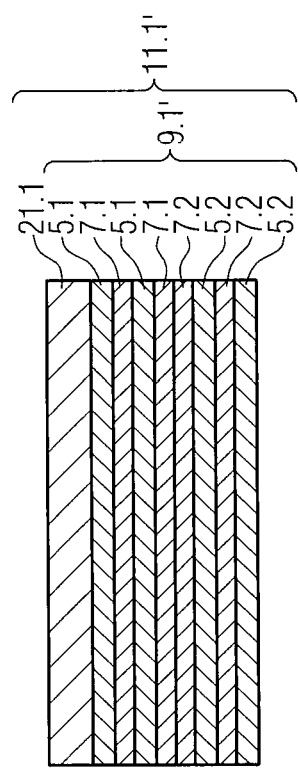
FIG. 3 A schematic view of subsequent process according to the present disclosure, illustrating an intermediate result.

FIG. 3 illustrates as subsequent processing step. FIG. 3 illustrates an intermediate result which may become final after evaluating a determining step. As illustrated in FIG. 3, one of the first and second host substrates 21.1 and 21.2 is removed from the combined coating structure. For illustrational purposes, FIG. 3 illustrates that the second host substrate 21.1 has been removed from the combined coating structure. That is, a removal or detaching step with regard to detaching one of the first and the second host substrates 21.1 and 21.2 is performed.

The removal of the host substrate 21.2 may be achieved by a removal process 33 as indicated in FIG. 2. The removal process 33 may comprise at least one of wet-etching, grinding, lapping, etc. such that the host substrate 21.2 is detached from the respective optical coating 9.2. Previously described substrate removal processes such as epitaxial lift-off, ELO, or the Smart Cut process involving ion implantation and subsequent annealing may not be applicable for the production of such low loss coatings as depicted in FIG. 2. ELO is not compatible with low index ternary $Al_xGa_{1-x}As$ alloys, i.e. for x>50%, while the ion implantation step required in the Smart Cut process may prove damaging to highly sensitive multilayers. Thus, the donor substrate removal process may comprise a first step of mechanically thinning the host substrate 21.2 by, for example, a grinding process. Then, the host substrate 21.2 material may be chemically removed from the combined optical structure, i.e. from the optical coating 9.2, thereby obtaining a resulting combined optical structure 11.1' of which one of the two host substrates, 21.1 or 21.2, has been detached. As pointed out above, for illustrational purposes, FIGS. 2 and 3 choose to illustrate that host substrate 21.2 is selectively detached.

The process step illustrated in FIG. 3 is followed by a determining step. The determining step refers to the parameters of the resulting combined optical structure, here 11.1', of the previous step. The determining step determines whether or not the resulting combined optical structure 11.1' fulfills a predetermined condition. The predetermined or predefined condition may comprise whether a thickness of the combined coating 11.1' is larger, i.e. thicker, than a predefined thickness or else the predefined condition may comprise whether a predefined number n of repetitions of the previous steps has been performed, where n is a positive integer larger than or equal to 1. In particular, having a known thickness of the first optical coating 9.1 and the second optical coating 9.2, repeating the above steps n times will accumulate a combined coating having a corresponding thickness which adds up from the individual thicknesses of the optical coatings 9.1. and 9.2, respectively.

In case the result of the determining step is negative, meaning that the predetermined condition has not been fulfilled, the process flow continues with the following steps.

Figure 4:
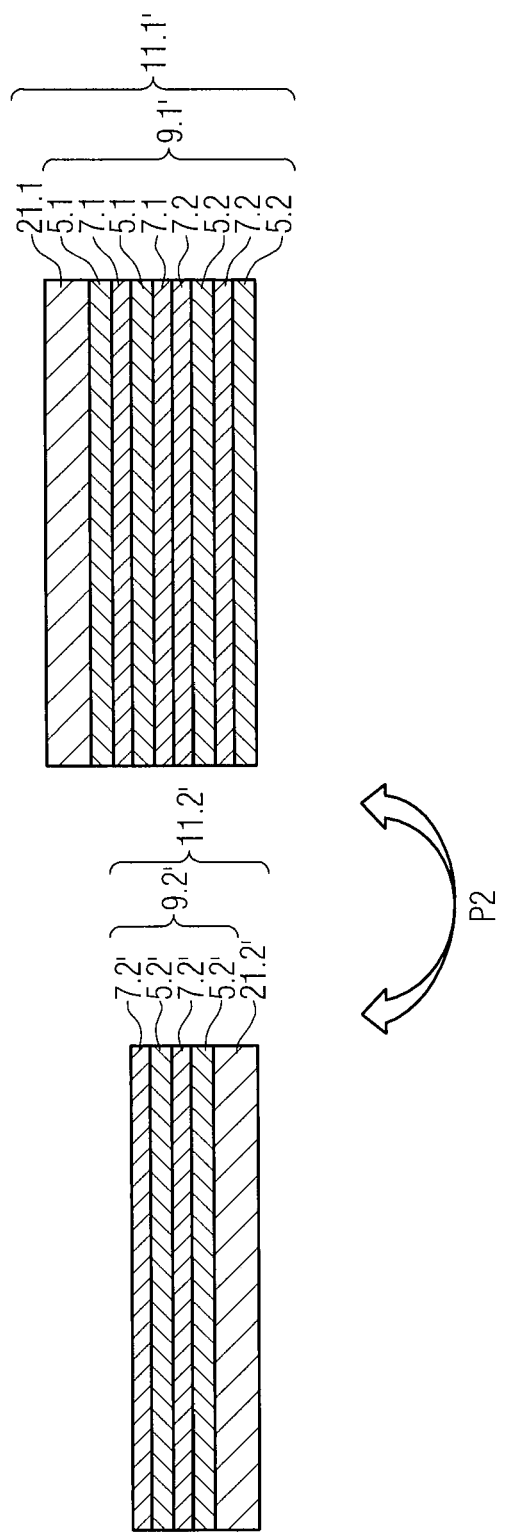
FIG. 4: A schematic view of a subsequent process indicating a further iteration according to the present disclosure.

FIG. 4 illustrates an immediate next step in case the determining step results to be negative. In FIG. 4, the resulting combined coating structure 11.1' as shown in FIG. 3 is taken to be the next, effective base coating structure. Likewise, as illustrated in FIG. 4 it is provided another optical coating 9.2' provided on another host substrate 21.2' which together form another or coating structure 11.2'. The optical coating 9.2' may comprise layers 5.2' and 7.2'. As indicated already in FIG. 1 the number of layers 5.2' and 7.2' may be the same as for the first coating structure 11.1 of FIG. 1, but now the coating structure 11.1' typically has more layers than the coating structure 11.2'. Also, as already indicated above the sequence of layers 5.2' and 7.2' as well as their parameters may be the same as for the first optical coating 9.1, such that the coating structure 11.2' is similar or even equal to the first coating structure 11.1 of FIG. 1. Alternatively, as described above, the coating structure 11.2' may differ from the coating structure 11.1 of FIG. 1. Thus the effective base coating structure 11.1' as well as the another coating structure 11.2' of FIG. 4 provide a pair of effective coating structures to be combined as indicated by the double arrow P2 of FIG. 2. In other words, the step as illustrated in FIG. 4 resembles the step of FIG. 1 but with a different base coating structure.

Figure 5:
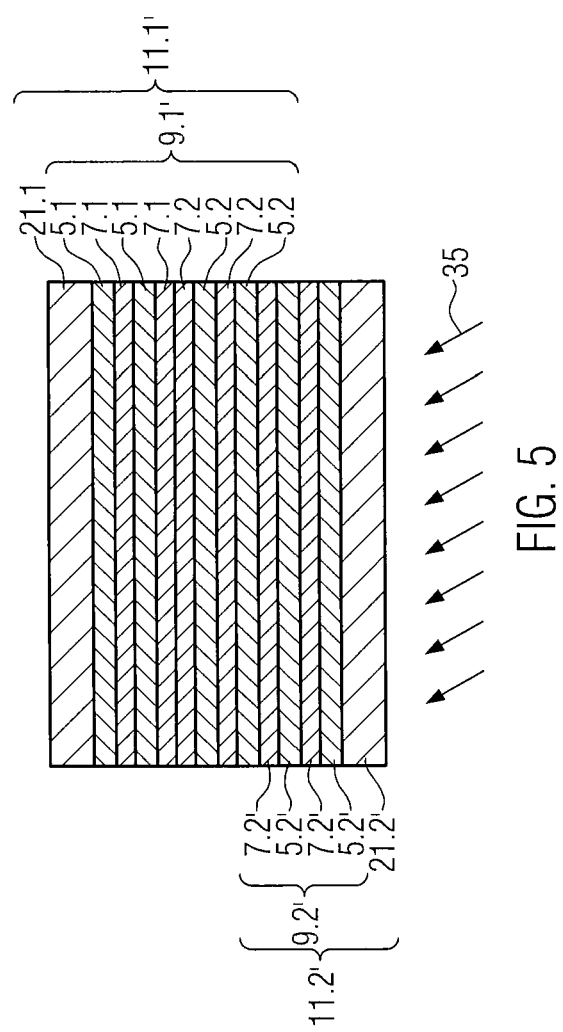
FIG. 5: A schematic view of a subsequent process according to the present disclosure.

FIG. 5 illustrates a subsequent step of the process flow following the step illustrated in FIG. 4, i.e. under the condition that the result of the determining step was negative. FIG. 5 resembles FIG. 2 by illustrating a combination of coating structure 11.1' and 11.2'. As described with respect to FIGS. 1 and 2, combining coating structures 11.1' and 11.2' is achieved by a direct bonding step. The direct bonding step may typically be the same as described for FIGS. 1 and 2 such that its description will not be repeated here. Further, and also similar as in FIG. 2, the bonding step is to be followed by a removal step 35 so as to remove the host substrate 21.2' from the structure shown in FIG. 5. The removal step 35 typically may be of the same kind as described with respect to FIG. 2 and thus will not be described here, again.

As indicated above, by combining the current base coating structure 11.1 and the another second coating structure, it is possible that a majority of growth defects may become buried at the bonding interface between the two structures instead of the top layers facing outward after the combining step. This, again may lead to a reduction in the coating scatter loss to levels below 5 ppm, which is an improvement of a factor of 2-4 compared to previously applied processes.

Figure 6:
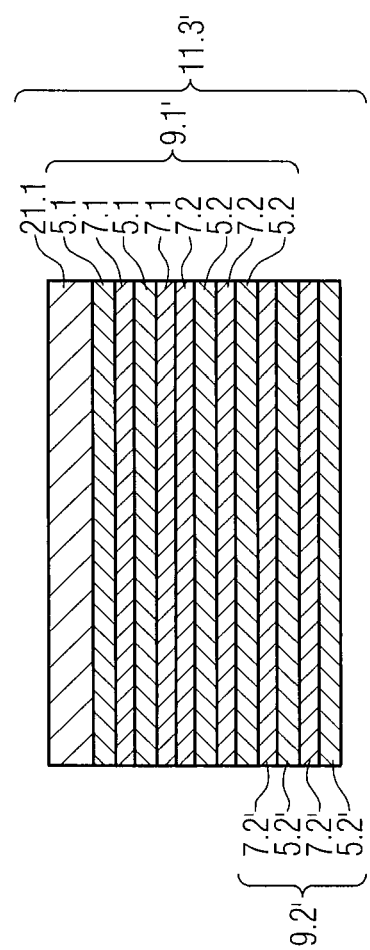
FIG. 6: A schematic view of subsequent process according to the present disclosure, illustrating an intermediate result.

FIG. 6 illustrates a subsequent step following the step illustrated in FIG. 5. After the removal step 35 of FIG. 5, it is obtained a current resulting combined optical structure 11.3'. The current resulting combined optical structure 11.3' thus has a larger thickness than the corresponding resulting combined optical structure obtained after having performed the step illustrated in FIG. 3.

Therefore the determining step as was performed after obtaining the result illustrated in FIG. 3 may now be performed, again. This determining step then may refer, again, to the parameters of the resulting combined optical structure, here 11.3', of the previous step. The determining step determines whether or not the resulting combined optical structure 11.3' fulfills the predetermined condition, i.e. the same predetermined condition as was posed with respect to FIG. 3. The predetermined or predefined condition thus again may comprise whether a thickness of the combined coating 11.3' is larger, i.e. thicker, than a predefined thickness or else the predefined condition may comprise whether a predefined number n of repetitions of the previous steps has been performed, where n is a positive integer larger than or equal to 1. For the latter, a respective counter counting the number of iterations has to be increased by 1. In particular, having a known thickness of the first optical coating 9.1 and the second optical coating 9.2, and thereby having a known thickness of the effective optical coating 9.1' and 9.2', respectively will accumulate a combined coating having a corresponding thickness which adds up from the individual thicknesses. Thus, by iterating the above describe steps, monocrystalline coatings with essentially arbitrary thickness can be achieved. This includes thicker coatings which are necessary for ultra-high reflectivity mirrors, in particular for the mid-infrared spectral region, for mirror center wavelengths in excess of 2 μm.

In case the result of the determining step performed after FIG. 6 is still negative, the procedure will continue by taking the optical structure 11.3' as the current, effective base structure and adding another coating structure as described with respect to FIGS. 1 and 2 or likewise 4 and 5, respectively.

In case the result of the determining step performed after any of the previous steps is positive, the predetermined condition has been fulfilled. This then means that the desired thickness of the combined coating has been achieved and/or the predefined number of envisaged repetitions/iterations of the above steps has been reached. Then FIG. 7 indicates a subsequent step provided that the determining step yielded a positive result.

Figure 7:
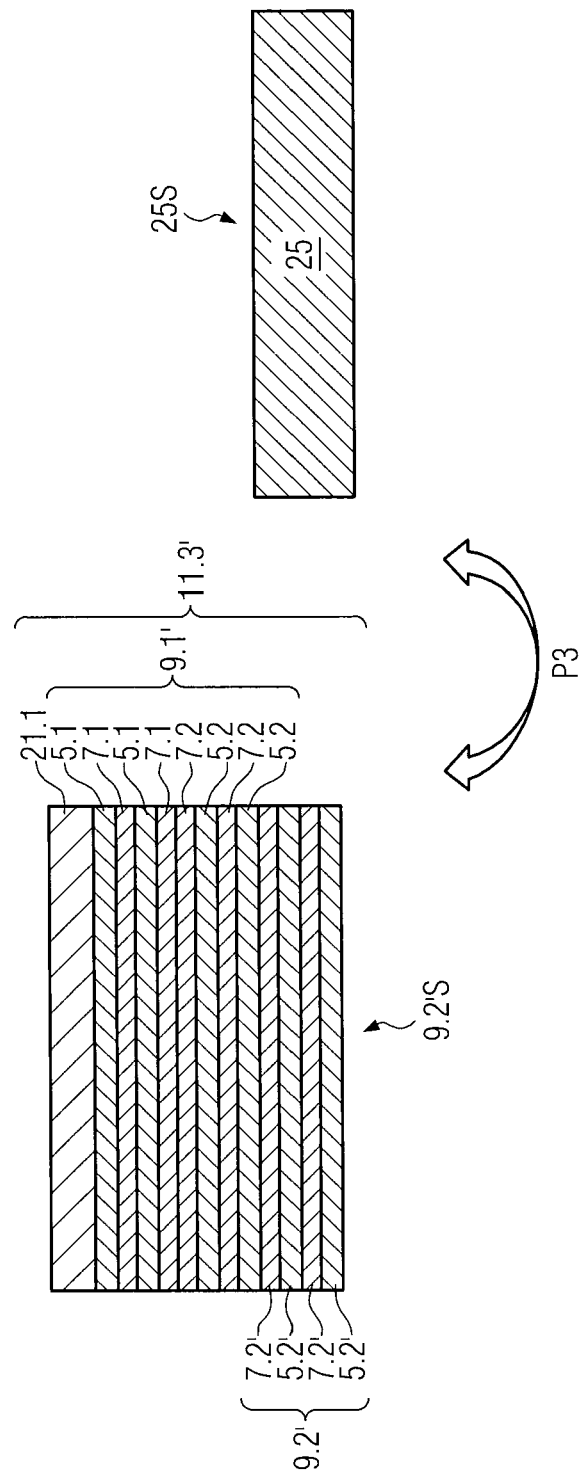
FIG. 7: A schematic view of subsequent process according to the present disclosure.

In FIG. 7 it is illustrated that the resulting combined optical structure 11.3' of FIG. 6, or likewise of FIG. 3, is provided alongside an optical substrate 25.

The optical substrate 25 of FIG. 7 has a top surface or working surface 25S of the optical substrate 25. This surface 25S may be polished. Likewise, the optical structure 11.3' has an outmost or free surface which here is denoted 9.2'. The surface 9.2' may also be polished. The optical structure 11.3' may then be combined with the optical substrate 25 by directly bonding the respective surfaces 9.2' and 25S, respectively. This is indicated by the double arrow P3.

Similar to the above illustrated coating-relevant bonding process, the bonding process between the combined optical structure 11.3' and the optical substrate 25 may involve direct bonding, i.e. with no intermediate adhesive layers. Again, growth defects which may be present at the surface 9.2' will be buried when bonding against the surface 25S of the optical substrate 25. To achieve proper bonding a press may be used. Thus, a defect-free bonding interface for the final substrate-transfer process onto the final optical substrate is advantageous for increasing manufacturing yield and also for suppressing wavefront errors caused by defect-induced voids at the coating-substrate interface.

Further, the entire structure shown in FIG. 7 can be annealed in order to generate a stronger bond between the structure 11.3' and the optical substrate 25. After pressing and annealing the structure 11.3' onto the optical substrate 25, the structure 11.3' has been firmly bonded to the optical substrate 25 thereby forming a mirror assembly 12. As is illustrated in FIGS. 7 and 8, the host substrate 211 is still attached to said mirror assembly 12.

Figure 8:
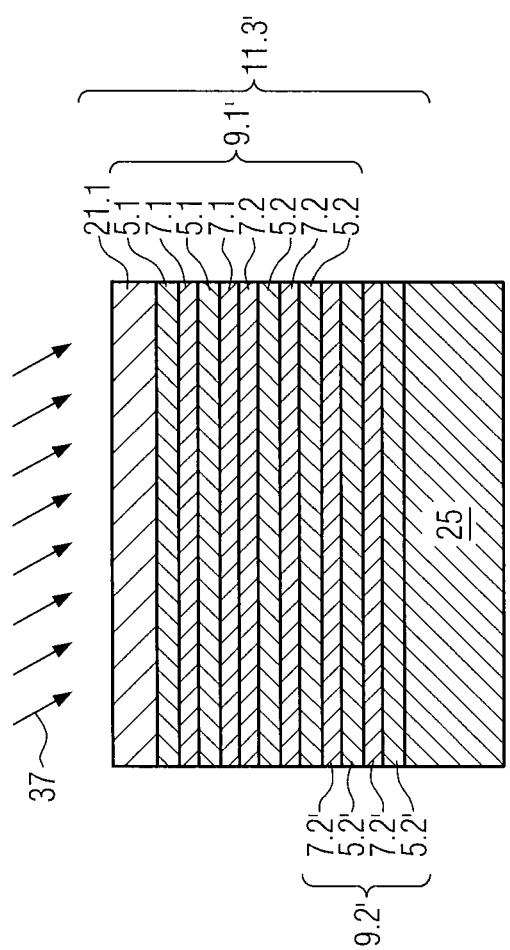
FIG. 8: A schematic view of subsequent process according to the present disclosure.

FIG. 8 illustrates a further step in which a removal process 37 is applied to remove the remaining host substrate 21.1 from the optical structure 11.3'. The removal process 37 may be similar as the removal process 33, and 35 described above.

Figure 9:
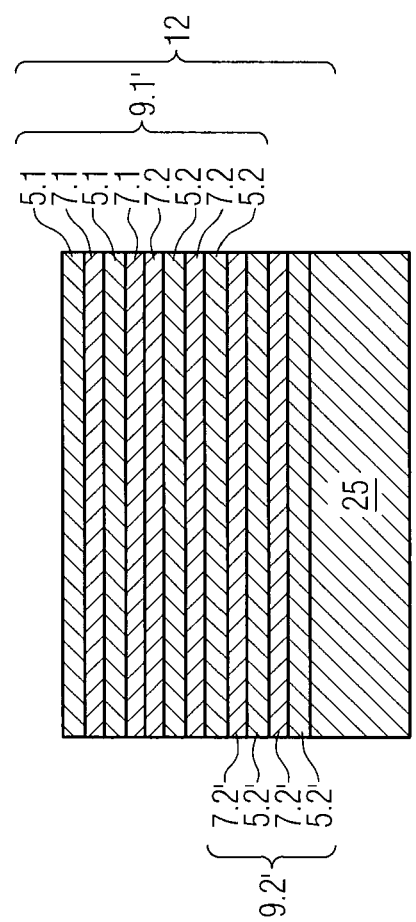
FIG. 9: A schematic view of subsequent process according to the present disclosure.

FIG. 9 illustrates the resulting transferred combined optical stack 12 on the optical substrate 25.

Whereas the above Figures have been shown with planar substrates, it should be understood that at least the optical substrate 25 may be also be chosen to be curved and may have a pre-determined radius of curvature between 0.1 and 10 m, with a typical value of 1 m, or a radius of curvature between 0.5 km and 10 km.

If the final application requires an extremely stable mirror structure with low optical losses and low Brownian noise, the coating should consist of a monocrystalline semiconductor multilayer. One potential example is AlGaAs-based coatings, which typically exhibit a limiting loss angle, i.e., the inverse of the mechanical quality factor, of a maximum of $1\times10^{-4}$ to a value below $10^{-5}$ depending on the system operating temperature. In addition, such coatings can typically provide a reflectivity >99.99%, with a total absorption <1 ppm for center wavelengths covering the near infrared spectral region, i.e., 1000-1600 nm. Typical values for center wavelengths are 1064 nm and 1550 nm, though the range of ~600 nm to ~10 µm is possible with GaAs/AlGaAs multilayers.

In summary, this disclosure covers the production of separately stacked coatings for a subsequent substrate-transfer step in order to transfer the previously stacked coating onto arbitrary substrates. The stacking procedure allows for various technological barriers to be overcome, including limitations of the total thickness for various deposition and/or crystal growth techniques as employed for the production of ultralow-loss optical coatings, as well as reductions in defect densities that may degrade the final performance of the optic. Additionally, the stacking process may enhance the optical quality and surface quality necessary for the substrate-transfer coating process, while also allowing for the combination of two different coating materials or structures including monocrystalline materials with different lattice constants, various amorphous and polycrystalline materials, electro-optically passive and active structures, or combinations therein.

The invention claimed is:

1. A method for manufacturing substrate-transferred stacked optical interference coatings, comprising:
    a) providing a first optical coating having layers of alternating high and low refractive indices on a first host substrate as a base coating structure;
    b) providing a second optical coating having layers of alternating high and low refractive indices on a second host substrate;
    c) directly bonding the first optical coating of the base coating structure to the second optical coating, thereby obtaining one combined coating;
    d) detaching one of the first or the second host substrates from the combined coating for determining (i) whether a thickness of the combined coating is larger than a predefined thickness, or (ii) whether a predefined number n of repetitions of steps b) to d) has been performed, where n is a positive integer larger than or equal to 1, and wherein the predefined thickness is 20 µm;
    e) in a case that the result of the determining step is negative, taking the combined coating together with a remaining host substrate as the base coating structure to be processed next and continuing with step b);
    f) in a case that the determining step is positive, providing an optical substrate and directly bonding the optical substrate to the combined coating; wherein growth defects are buried due to direct bonding; and
    g) removing the other one of the first or second host substrate;
    wherein a reflectivity of the combined coating depends on a refractive index contrast of individual layers, a total number of layers, and a refractive index of the first or second host substrate.

2. The method according to claim 1, wherein the the first and second host substrates comprise the same semiconductor wafer.

3. The method according to claim 2, wherein the number of layers in the first optical coating is the same as the number of layers in the second optical coating.

4. The method according to claim 1, wherein the first host substrate and the second host substrate differ in thickness and/or material.

5. The method according to claim 1, wherein the number of layers in the first optical coating is the same as the number of layers in the second optical coating.

6. The method according to claim 1, wherein the first host substrate and the second host substrate differ in thickness and/or material.

7. The method according to claim 6, wherein the first optical coating and the second optical coating are the same in thickness and material.

8. The method according to claim 1, wherein at least one second optical coating differs from the first optical coating in thickness and/or material.

9. The method according to claim 1, the first optical coating and/or the second optical coating being a single crystal optical coating, wherein the step of forming the first optical coating and/or the second optical coating on the respective first or second host substrate comprises depositing the first optical coating and/or the second optical coating, respectively, via an epitaxial growth technique selected from a group consisting of molecular beam epitaxy and organometallic vapor-phase epitaxy.

10. The method according to claim 1, wherein the step of forming the first and/or the second optical coating further comprises lithographically defining a lateral geometry of the first and/or the second optical coating.

11. The method according to claim 10, wherein the step of forming the first and/or the second optical coating further comprises extruding the defined lateral geometry of the first and/or the second optical coating and at least partially into the respective first and/or second host substrate by means of chemical etching; or wherein the step of forming the first and/or the second optical coating comprises singulating the first and/or the second optical coating using mechanical dicing and/or grinding processes and removing remaining host substrate off the first and/or the second optical coating via selective chemical etching.

12. The method according to claim 1, wherein the optical substrate is curved having a radius of curvature between 0.1 m and 10 m or between 0.5 km and 10 km.

13. The method according to claim 1, wherein the first host substrate comprises at least one of GaAs, and/or Ge, and/or Si and/or InP; wherein the optical substrate is transparent, in particular at a wavelength of 1064 nm or 1550 nm, as well as for wavelengths from 2 to 10 µm and wherein a top surface of the optical substrate is polished.

14. The method according to claim 1, wherein the optical substrate comprises SiO$_2$, sapphire, ultra-low expansion glass (ULE), Si, Ge, ZnSe.

15. The method according to claim 1, wherein the layers of alternating high and low refractive indices in the first or the second optical coating comprise crystalline semiconductor layers being monocrystalline epitaxial layers of GaAs and AlGaAs.

\* \* \* \* \*